US012599050B2

(12) United States Patent
Karhade et al.

(10) Patent No.: US 12,599,050 B2
(45) Date of Patent: Apr. 7, 2026

(54) MULTI-LEVEL DIE COUPLED WITH A SUBSTRATE

(71) Applicant: Intel Corporation, Santa Clara, CA (US)

(72) Inventors: Omkar Karhade, Chandler, AZ (US); Sai Vadlamani, Gilbert, AZ (US); Xavier F. Brun, Chandler, AZ (US); Hemanth Dhavaleswarapu, Tempe, AZ (US)

(73) Assignee: Intel Corporation, Santa Clara, CA (US)

( * ) Notice: Subject to any disclaimer, the term of this patent is extended or adjusted under 35 U.S.C. 154(b) by 856 days.

(21) Appl. No.: 17/356,046

(22) Filed: Jun. 23, 2021

(65) Prior Publication Data

US 2022/0415770 A1 Dec. 29, 2022

(51) Int. Cl.
*H01L 23/528* (2006.01)
*H01L 21/50* (2006.01)
(Continued)

(52) U.S. Cl.
CPC ........ *H01L 23/49816* (2013.01); *H01L 21/50* (2013.01); *H01L 23/528* (2013.01);
(Continued)

(58) Field of Classification Search
CPC . H01L 23/49816; H01L 21/50; H01L 23/528; H01L 24/14; H01L 31/02; H01L 33/62; H01L 2021/60022; H01L 24/17; H01L 2224/73253; H01L 25/50; H01L 2224/0401; H01L 2224/16145; H01L 2224/16227; H01L 2224/1703; H01L 2224/17181; H01L 2224/32145; H01L 2224/73204; H01L 2224/81191; H01L 2224/81193; H01L 2224/92125; H01L 2225/06513; H01L 2225/06517; H01L 2225/06534; H01L 2225/06562;
(Continued)

(56) References Cited

U.S. PATENT DOCUMENTS 4,737,008 A 4/1988 Ohyama
5,155,784 A 10/1992 Knott
(Continued)

OTHER PUBLICATIONS

Aleksov et al., "Organic Package Substrates Using Lithographic Via Technology for RF to THz Applications," 2020 IEEE International Electron Devices Meeting (IEDM), San Francisco, CA, USA, 2020, pp. 17.5.1-17.5.4 (Year: 2020).
(Continued)

*Primary Examiner* — Elias Ullah
(74) *Attorney, Agent, or Firm* — Schwabe, Williamson & Wyatt P.C.

(57) ABSTRACT

Embodiments described herein may be related to apparatuses, processes, and techniques related to multilevel dies, in particular to photonics integrated circuit dies with a thick portion and a thin portion, where the thick portion is placed within a cavity in a substrate and the thin portion serves as an overhang to physically couple with the substrate, to reduce a distance between electrical contacts on the thin portion of the die and electrical contacts on the substrate. Other embodiments may be described and/or claimed.

21 Claims, 8 Drawing Sheets

(51) Int. Cl.

| | |
|---|---|
| *H01L 23/00* | (2006.01) |
| *H01L 23/498* | (2006.01) |
| *H10F 77/00* | (2025.01) |
| *H10H 20/857* | (2025.01) |
| *H01L 21/60* | (2006.01) |

(52) U.S. Cl.
CPC ............. *H01L 24/14* (2013.01); *H10F 77/00* (2025.01); *H10H 20/857* (2025.01); *H01L 2021/60022* (2013.01)

(58) Field of Classification Search
CPC . H01L 2924/15153; H01L 2924/15313; H01L 23/3121; H01L 23/5385; H01L 23/5389; H01L 25/0657; H01L 25/18; H01L 21/563; G02B 6/4243; G02B 6/4245; G02B 6/4274
See application file for complete search history.

(56) References Cited

U.S. PATENT DOCUMENTS

| | | | |
|---|---|---|---|
| 5,877,038 | A | 3/1999 | Coldren |
| 6,081,037 | A | 6/2000 | Lee |
| 6,485,192 | B1 | 11/2002 | Plotts |
| 6,493,489 | B2 | 12/2002 | Mertz |
| 6,653,158 | B2 | 11/2003 | Hall |
| 6,687,281 | B2 | 2/2004 | Coldren |
| 6,714,573 | B2 | 3/2004 | Coldren |
| 6,798,817 | B2 | 9/2004 | Coldren |
| 6,810,064 | B1 | 10/2004 | Coldren |
| 6,841,407 | B2 | 1/2005 | Coldren |
| 8,622,632 | B2 | 1/2014 | Isenhour |
| 8,729,714 | B1 * | 5/2014 | Meyer ..................... H01L 24/92 257/777 |
| 9,312,198 | B2 | 4/2016 | Meyer |
| 9,568,679 | B2 | 2/2017 | Doany |
| 9,880,366 | B2 | 1/2018 | Vallance |
| 9,985,005 | B2 | 5/2018 | Meyer |
| 10,168,497 | B2 | 1/2019 | Merget |
| 10,615,567 | B1 | 4/2020 | Gelhausen |
| 10,985,285 | B2 | 4/2021 | Yonkee |
| 11,171,464 | B1 | 11/2021 | Bishop |
| 11,353,667 | B2 | 6/2022 | Hung |
| 11,432,056 | B1 | 8/2022 | Doerr |
| 11,532,922 | B2 | 12/2022 | Forman |
| 11,588,298 | B2 | 2/2023 | Cheung |
| 11,789,221 | B2 | 10/2023 | Tang |
| 2001/0055324 | A1 | 12/2001 | Ota |
| 2002/0024989 | A1 | 2/2002 | Coldren |
| 2002/0025589 | A1 | 2/2002 | Hall |
| 2002/0071464 | A1 | 6/2002 | Coldren |
| 2002/0090016 | A1 | 7/2002 | Coldren |
| 2002/0101894 | A1 | 8/2002 | Coldren |
| 2008/0002929 | A1 | 1/2008 | Bowers |
| 2009/0168821 | A1 | 7/2009 | Fang |
| 2011/0147860 | A1 * | 6/2011 | Robert .................. G01P 15/125 257/415 |
| 2011/0211604 | A1 | 9/2011 | Roscher |
| 2014/0042614 | A1 | 2/2014 | Yu |
| 2014/0264914 | A1 | 9/2014 | Meyer |
| 2016/0085038 | A1 | 3/2016 | Decker |
| 2016/0190107 | A1 | 6/2016 | Meyer |
| 2017/0054269 | A1 | 2/2017 | Tamura |
| 2017/0194308 | A1 | 7/2017 | Evans |
| 2017/0236807 | A1 | 8/2017 | Hwang |
| 2018/0217343 | A1 | 8/2018 | Matsumura |
| 2019/0028189 | A1 | 1/2019 | Teranishi |
| 2019/0041576 | A1 | 2/2019 | Byrd |
| 2019/0207043 | A1 | 7/2019 | Yonkee |
| 2019/0271819 | A1 | 9/2019 | Meade |
| 2019/0324222 | A1 | 10/2019 | Kettler |
| 2019/0393121 | A1 | 12/2019 | Swaminathan |
| 2020/0211923 | A1 | 7/2020 | Norberg |
| 2020/0244036 | A1 | 7/2020 | Forman |
| 2021/0149128 | A1 | 5/2021 | Schaevitz |
| 2021/0215895 | A1 | 7/2021 | Kazama |
| 2021/0364712 | A1 | 11/2021 | Hung |
| 2022/0061148 | A1 | 2/2022 | Mentovich |
| 2022/0239068 | A1 | 7/2022 | Kearns |
| 2022/0342164 | A1 | 10/2022 | Chen |
| 2022/0397726 | A1 | 12/2022 | Karhade |
| 2022/0413236 | A1 | 12/2022 | Karhade |

OTHER PUBLICATIONS

Asano et al., "InP-based all-epitaxial 1.3-μm VCSELs with selectively etched AlInAs apertures and Sb-based DBRs," in IEEE Photonics Technology Letters, vol. 15, No. 10, pp. 1333-1335, Oct. 2003 (Year: 2003).

Holder et al., Nonpolar ILL-nitride vertical-cavity surface emitting lasers with a polarization ratio of 100% fabricated using photoelectrochemical etching. Appl. Phys. Lett. Jul. 21, 2014; 105 (3): 031111 (Year: 2014).

Long et al., Polarization mode control of long-wavelength VCSELs by intracavity patterning, Opt. Express 24, 9715-9722 (2016) (Year: 2016).

Office Action for U.S. Appl. No. 17/358,530 mailed Mar. 20, 2025, 11 pgs.

Notice of Allowance for U.S. Appl. No. 17/358,530 mailed Oct. 20, 2025, 8 pgs.

Office Action for U.S. Appl. No. 17/357,938 mailed Nov. 20, 2024, 15 pgs.

Final Office Action for U.S. Appl. No. 17/357,938 mailed May 5, 2025, 16 pgs.

Office Action for U.S. Appl. No. 17/358,502 mailed Dec. 2, 2024, 10 pgs.

Final Office Action for U.S. Appl. No. 17/358,502 mailed Apr. 24, 2025, 11 pgs.

Office Action for U.S. Appl. No. 17/357,941 mailed Nov. 1, 2024, 13 pgs.

Final Office Action for U.S. Appl. No. 17/357,941 mailed Feb. 12, 2025, 17 pgs.

Office Action for U.S. Appl. No. 17/357,941 mailed May 22, 2025, 17 pgs.

* cited by examiner

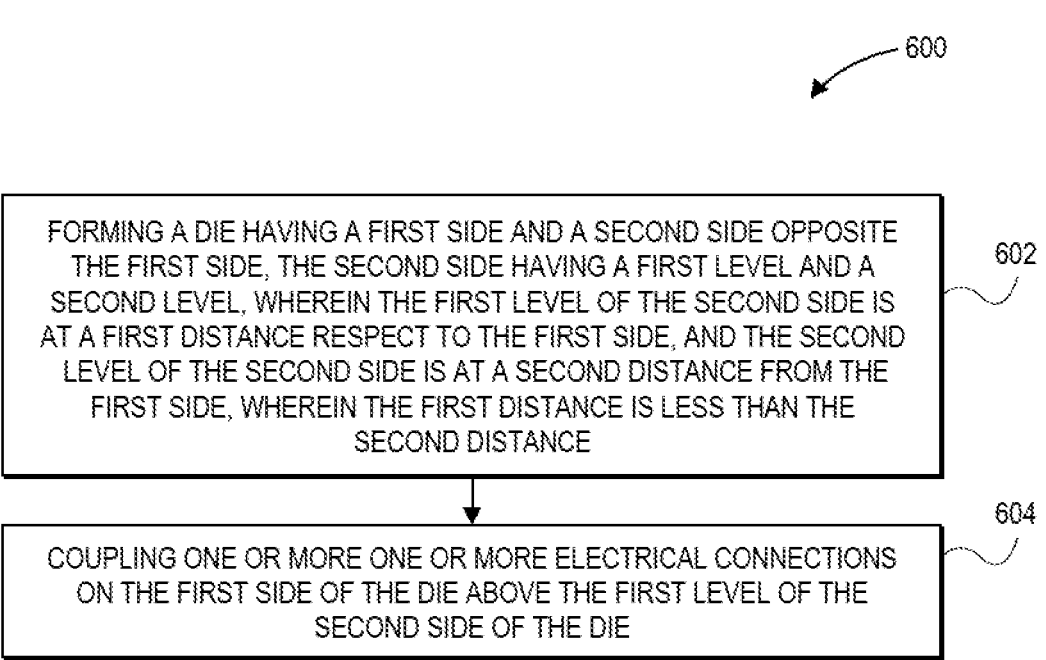

600

602

FORMING A DIE HAVING A FIRST SIDE AND A SECOND SIDE OPPOSITE THE FIRST SIDE, THE SECOND SIDE HAVING A FIRST LEVEL AND A SECOND LEVEL, WHEREIN THE FIRST LEVEL OF THE SECOND SIDE IS AT A FIRST DISTANCE RESPECT TO THE FIRST SIDE, AND THE SECOND LEVEL OF THE SECOND SIDE IS AT A SECOND DISTANCE FROM THE FIRST SIDE, WHEREIN THE FIRST DISTANCE IS LESS THAN THE SECOND DISTANCE

604

COUPLING ONE OR MORE ONE OR MORE ELECTRICAL CONNECTIONS ON THE FIRST SIDE OF THE DIE ABOVE THE FIRST LEVEL OF THE SECOND SIDE OF THE DIE

FIG. 6

MULTI-LEVEL DIE COUPLED WITH A SUBSTRATE

FIELD

Embodiments of the present disclosure generally relate to the field of semiconductor packaging, and in particular to placing dies on a package.

BACKGROUND

Continued growth in computing and mobile devices will continue to increase the demand for increased bandwidth density between dies within semiconductor packages.

BRIEF DESCRIPTION OF THE DRAWINGS

FIG. 6 illustrates an example of a process for coupling a die having a ledge with a substrate that includes a cavity, in accordance with various embodiments.

DETAILED DESCRIPTION

Figure 1:
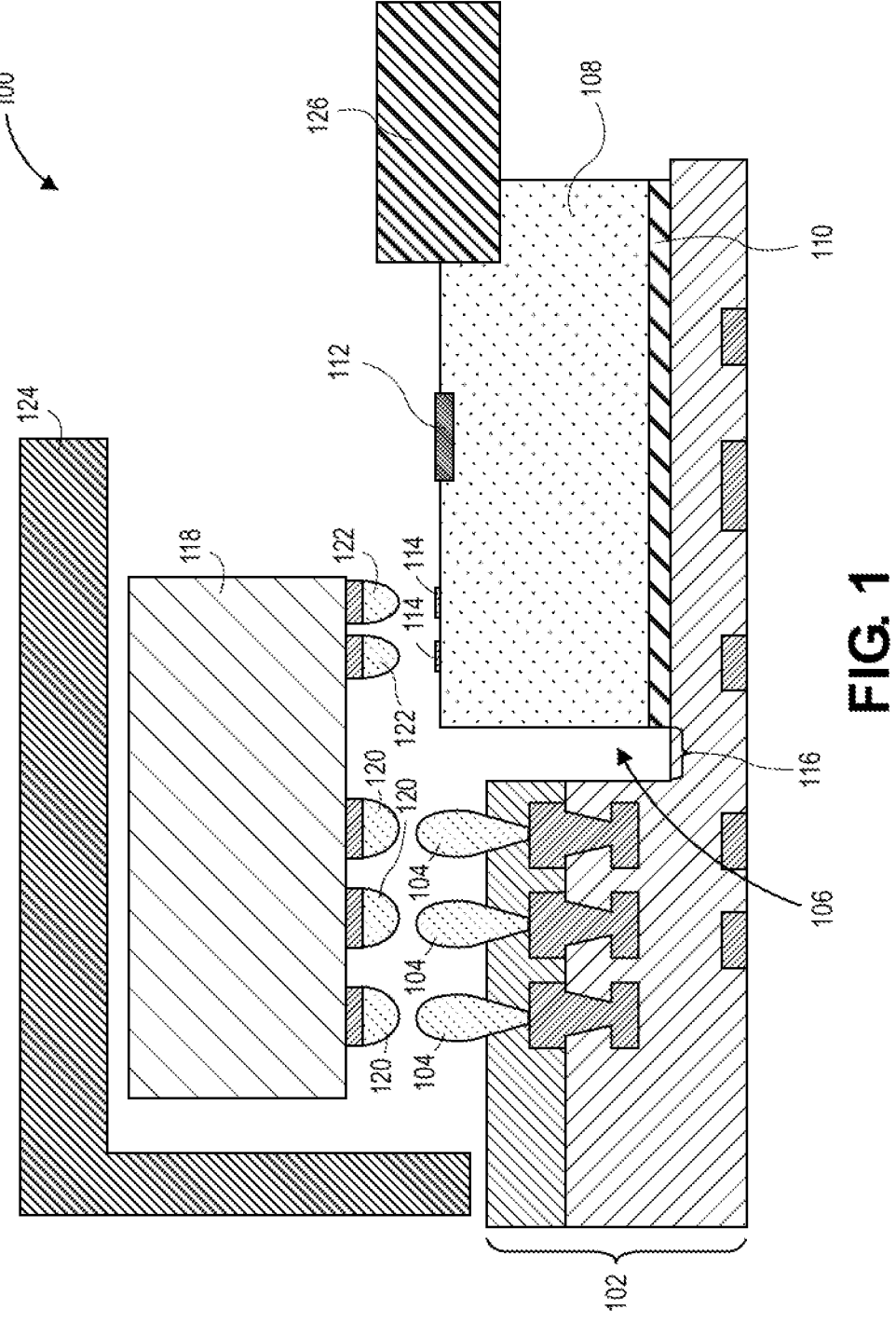
FIG. 1 illustrates a block diagram of a legacy package that includes a photonics integrated circuit (PIC) placed within a substrate cavity.

Embodiments described herein may be related to apparatuses, processes, and techniques related to dies, in particular to photonics integrated circuits (PIC) that have a thick portion and a thin portion, where the thick portion is placed within a cavity in a substrate. In embodiments, the thin portion serves as an overhang that may come into contact with other components, such as a substrate, to reduce a distance between electrical contacts on the thin portion of the PIC and other electrical contacts on the substrate. A transition between the thin portion and the thick portion within the PIC may be designed to reduce mechanical stress that may be placed on the thin portion of the PIC.

In embodiments, a portion of the PIC die may be at a greater thickness, for example 100 μm to 500 μm, where laser and/or other mechanical stress-sensitive components may be located. In embodiments, a portion of the PIC die may be thinned, between 50 μm to 60 μm for example, for overhang regions where electrical circuitry may be present. In embodiments, solder resist may be removed around a cavity to allow solder ball placement stencil keep out zone region so that the PIC overhang may extend there.

Embodiments may result in a substrate bump to PIC bump electrical conductivity distance that may be reduced to 215 μm or less. In embodiments, an ABF surface can be used for Z referencing when placing the PIC die. In addition, laser and mechanically sensitive components may be moved within the thick portion of the PIC to avoid any possible mechanical stresses on the thin portion of the PIC die.

In the following detailed description, reference is made to the accompanying drawings which form a part hereof, wherein like numerals designate like parts throughout, and in which is shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B and C).

The description may use perspective-based descriptions such as top/bottom, in/out, over/under, and the like. Such descriptions are merely used to facilitate the discussion and are not intended to restrict the application of embodiments described herein to any particular orientation.

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other. The term "directly coupled" may mean that two or more elements are in direct contact.

Various operations may be described as multiple discrete operations in turn, in a manner that is most helpful in understanding the claimed subject matter. However, the order of description should not be construed as to imply that these operations are necessarily order dependent.

As used herein, the term "module" may refer to, be part of, or include an ASIC, an electronic circuit, a processor (shared, dedicated, or group) and/or memory (shared, dedicated, or group) that execute one or more software or firmware programs, a combinational logic circuit, and/or other suitable components that provide the described functionality.

Various Figures herein may depict one or more layers of one or more package assemblies. The layers depicted herein are depicted as examples of relative positions of the layers of the different package assemblies. The layers are depicted for the purposes of explanation, and are not drawn to scale. Therefore, comparative sizes of layers should not be assumed from the Figures, and sizes, thicknesses, or dimensions may be assumed for some embodiments only where specifically indicated or discussed.

FIG. 1 illustrates a block diagram of a legacy package that includes a photonics integrated circuit (PIC) placed within a substrate cavity. Legacy package 100 shows an open cavity PIC schematic that includes a substrate 102 with a first set of bumps 104 at a top side of the substrate 102. A cavity 106 has been removed from the substrate 102, into which a PIC 108 has been inserted. The PIC 108 may be coupled to the bottom of the cavity 106 using a solder 110, or some other adhesive material.

The top side of the PIC 108 may include one or more laser elements, as well as one or more electrical connectors 114 positioned at the top of the PIC 108 and close to the substrate bumps 104. Due to the cavity 106 manufacturing process, there is a gap 116 between an edge of the PIC 108 and an edge of the substrate 102 based upon the manufacturing methods of the cavity 106.

An electronic integrated circuit (EIC) 118 is physically and electrically coupled with the substrate 102 and the PIC 108. In particular, EIC 118 bumps 120 couple with substrate 102 bumps 104, and EIC 118 bumps 122 are to couple with PIC 108 electrical connectors 114. The PIC 108 is only coupled with the substrate 102 via the EIC 118. An integrated heat spreader (IHS) 124 is thermally coupled with the substrate 102, with the EIC 118, and with other components of the package (not shown). A fiber attach 126 may be coupled with a side of the PIC 108, and may use a V-groove for fiber alignment.

Optical interconnects offer very high bandwidths compared to electrical interconnects. Photonic ICs (PIC) are used within semiconductor packages to convert electrical signal to optical signals and vice versa. Open cavity based integration of PICS offers direct PIC to EIC electrical and physical connection for better power efficiency, clean access for fiber attach and access to hotspots on PIC for cooling. PICS have lasing components which are sensitive to mechanical stresses. Also, legacy fiber attach 126 methods such as V groove fiber alignment requires the PIC to be ~200 um or more thick. Thicker PICS require a deeper cavity.

Deep cavity substrates are manufactured by laser ablating either the outline of the cavity or the entire cavity in a substrate. This ablation process leads to sloping edges of the cavity, which may further increase the distance between a top of the substrate 102 with a top of the PIC 108 when seated within the cavity 106. In legacy implementations, a solder based PIC attach within area 110 may be used for Z height control and/or to connect to a power supply (not shown). As a result, a solder paste printing method or ball drop method may be used to put the solder inside cavity 106 within the area 110. A stencil used for these solder paste printing or ball drop operations need to rest on an edge of the substrate 102, causing the first substrate bump 104 next to the cavity 106 to be significantly distanced from first PIC bump 114. As a result, in these legacy implementations power efficiency losses are increased, as well as PIC 108 power supply route through the EIC 118 becomes longer, leading to an increased voltage drop.

These legacy implementations have challenges. For example, a thin PIC, for example approximately 50 μm to 60 μm, can sit on a ABF layer such as layer 110 underneath solder resist, which allows for micro ball drop in openings within the ABF layer, however the thin PIC cannot support the groove-based fiber attach such as fiber attach 126. A non-solder based attach implementation eliminates some of the stencil KOZs, however a solder based attach helps absorb large Z-height variations in thicker PIC 108 and in deeper cavities 106 to make sure the PIC 108 to EIC 118 bonding, or other top die bonding, can happen at a tight pitch. Finally, legacy implementations may use or a compliant adhesive to eliminate stencil related KOZs, but deep cavities may have large sloping edges as discussed above that will increase the distance of the gap 116. Thus, in legacy implementation, those KOZs cannot be avoided.

Figure 2:
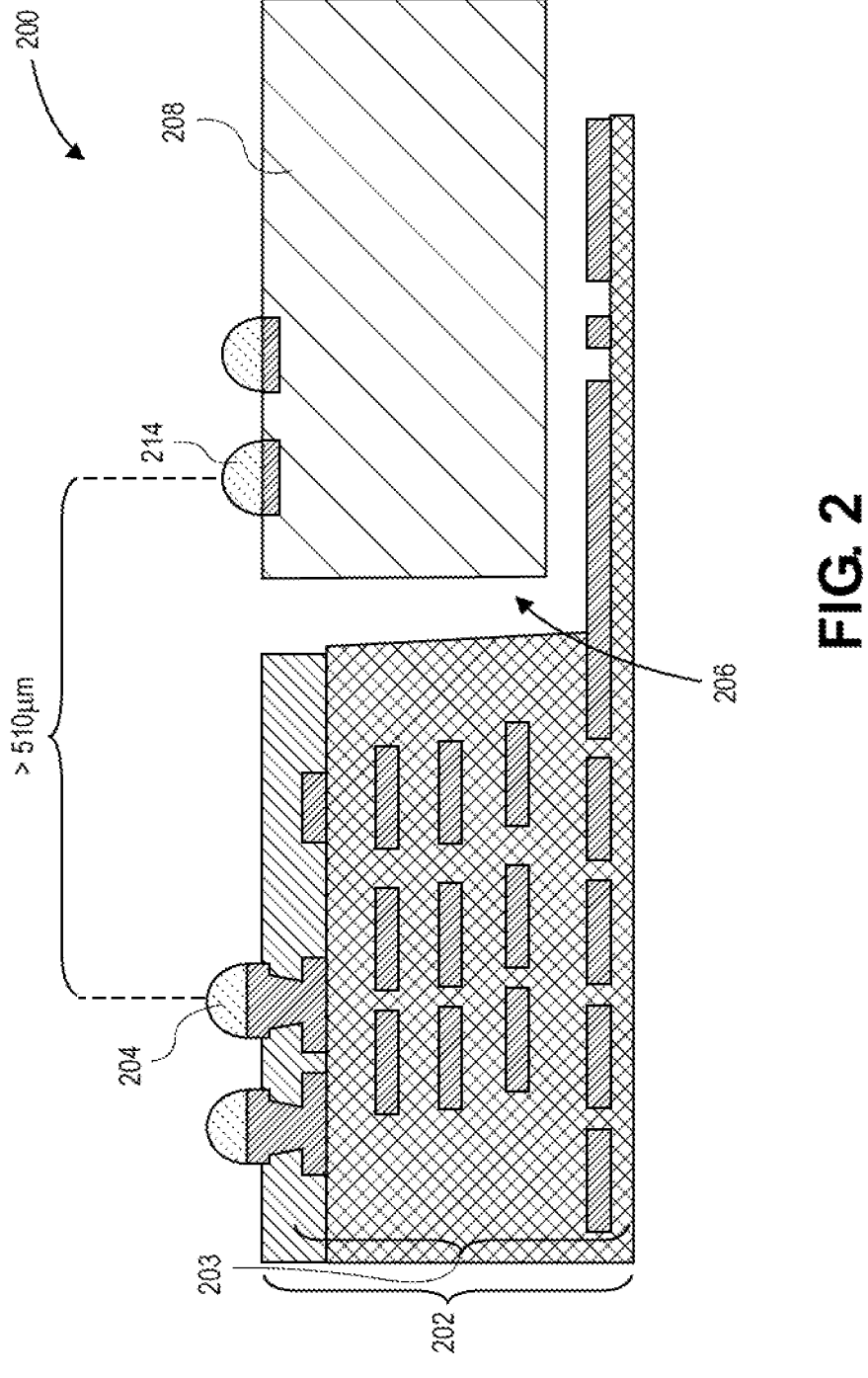
FIG. 2 illustrates a block diagram of a legacy package that shows a PIC bump to a substrate bump distance.

FIG. 2 illustrates a block diagram of a legacy package that shows a PIC bump to a substrate bump distance. Legacy package 200 shows a legacy PIC 208 within a cavity 206 of the substrate 202, which may be similar to legacy PIC 108, cavity 106, and substrate 102 of FIG. 1. The positioning of the traces within the various layers 203 of the substrate 202 result in a large distance between a solder ball 204 of the substrate 202 and the nearest electrical connection 214 of PIC 208. As shown, the distance in total may be greater than 500 μm.

Figure 3:
FIG. 3 illustrates a package that includes a PIC die with a top ledge overlapping a top of a substrate to reduce PIC bump to substrate bump distances, in accordance with various embodiments.

FIG. 3 illustrates a package that includes a PIC die with a top ledge overlapping a top of a substrate to reduce PIC bump to substrate bump distances, in accordance with various embodiments. Package 300 shows an example of a substrate 302 that includes a plurality of layers 303 that includes various traces. A cavity 306, which may be similar to cavity 106 of FIG. 1, is created within a side of the substrate 302, into which a PIC 308 is placed.

In embodiments, the PIC 308 may have a thick portion 309 and a thin portion 307. In embodiments, the thick portion 309 may range from 50 μm to 200 μm thick. In embodiments, the thin portion may range from 1 μm to 1 mm. A transition portion 311 of the PIC 308 shows a transition within the PIC 308 from the thick portion 309 to the thin portion 307. As shown, the transition portion 311 is a slanted plane, however other transition structures may be used and examples are discussed below with respect to FIG. 4.

A bottom of the thin portion 307 may come into physical contact and be supported by a top surface 302a of the substrate 302. As shown, part of the top of the substrate 302 may have been removed to expose the top surface 302a. One or more solder balls 330 may be placed underneath the thick portion 309 of the PIC 308 in order to adjust a height of the PIC 308 within the cavity 306, as well as to adjust the angle of a top of the PIC 308 so that the thin portion 307 may properly align with the top surface 302a.

The top of the substrate 302 may include one or more solder balls 304, or other electrical connections. The top of the PIC 308 within the thin portion 307 may also include one or more solder balls 314, pads, or other electrical connections. As shown with respect to package 300, the distance between solder ball 304 and solder ball 314 may be reduced to 250 μm or less using embodiments of the PIC 308, which may also be referred to as an overhanging PIC 308.

A fiber attach 326 may be coupled to the thick portion 309 of the PIC 308 as shown, and be directly optically coupled with optical circuitry within the thick portion 309. In embodiments, the PIC 308 may be at an edge of the substrate 302, where the fiber attach 326 may be easily accessed to receive one or more optical fibers (not shown).

Figure 4:
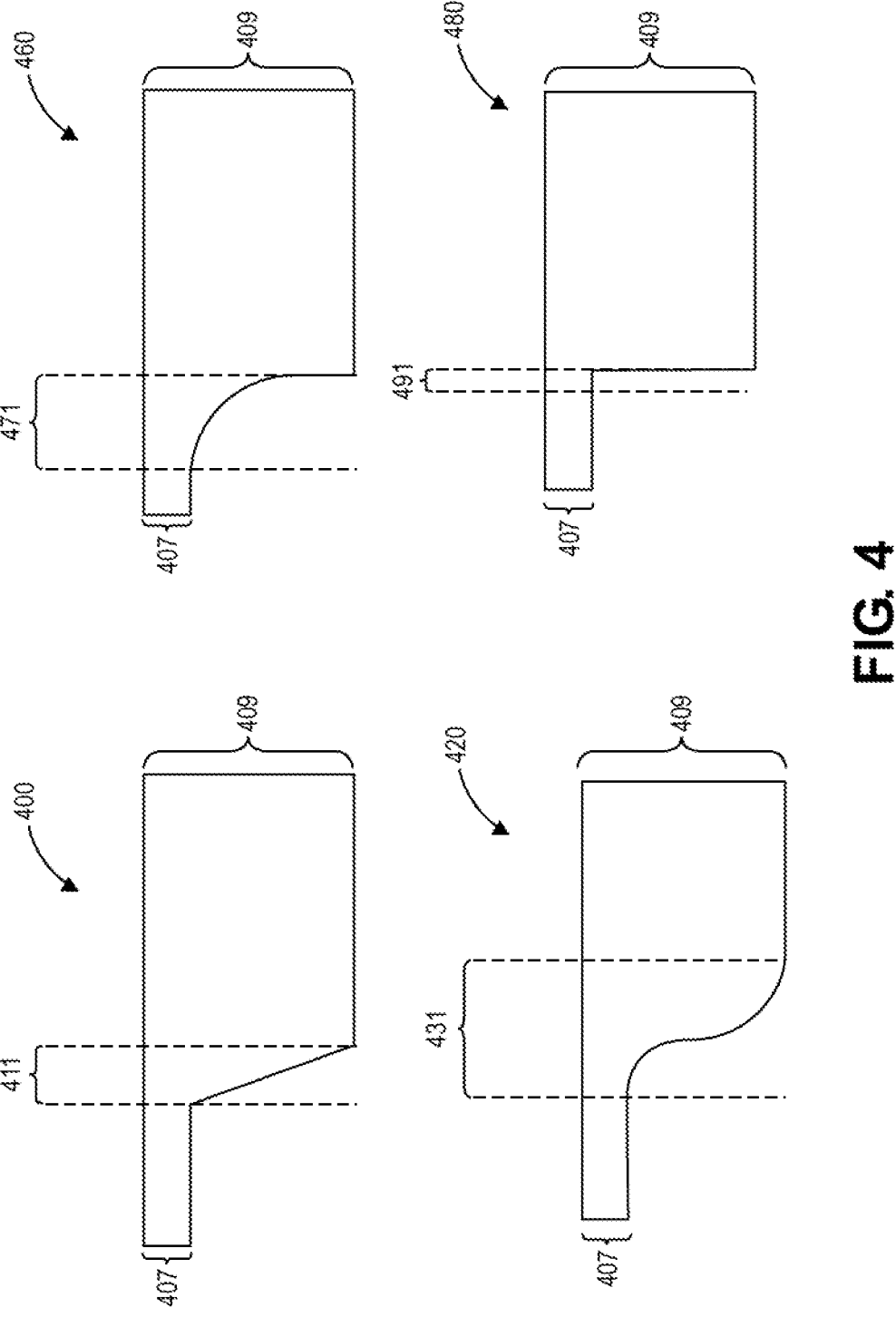
FIG. 4 illustrates examples of various designs of a PIC die with a top ledge, in accordance with various embodiments.

FIG. 4 illustrates examples of various designs of a PIC die with a top ledge, in accordance with various embodiments. PICS 400, 420, 460, and 480, which may be similar to PIC 330 of FIG. 3, show various designs for a transition area, for example transition area 311 of FIG. 3, where a bottom of the thick portion 409 transitions to the bottom of the thin portion 407.

PIC 400 shows an example similar to PIC 308 of FIG. 3, where the transition area 411 forms a plane that extends from the bottom of the thick portion 409 to the top of the thin portion 407.

PIC 420 shows an example of a curved surface within transition area 431 to provide additional structural support to the thin portion 407, as well as to provide additional distance from a bottom of the substrate, such as substrate 302 of FIG. 3, for various components.

PIC 460 shows an example of partially arched transition 471 to provide additional structural support to the thin portion 407.

PIC 480 shows an example of a more narrow transition 491 that includes a small radius to allow a longer thin portion 407 to extend further over a substrate, such as substrate 302 of FIG. 3.

FIGS. 5A-5D illustrates various stages in a manufacturing process to couple a PIC die with a top ledge placed within a substrate cavity with the top ledge coupled with a top of the substrate, in accordance with various embodiments. These various stages may be performed using the techniques, apparatus, systems, and processes discussed herein.

Figure 5A:
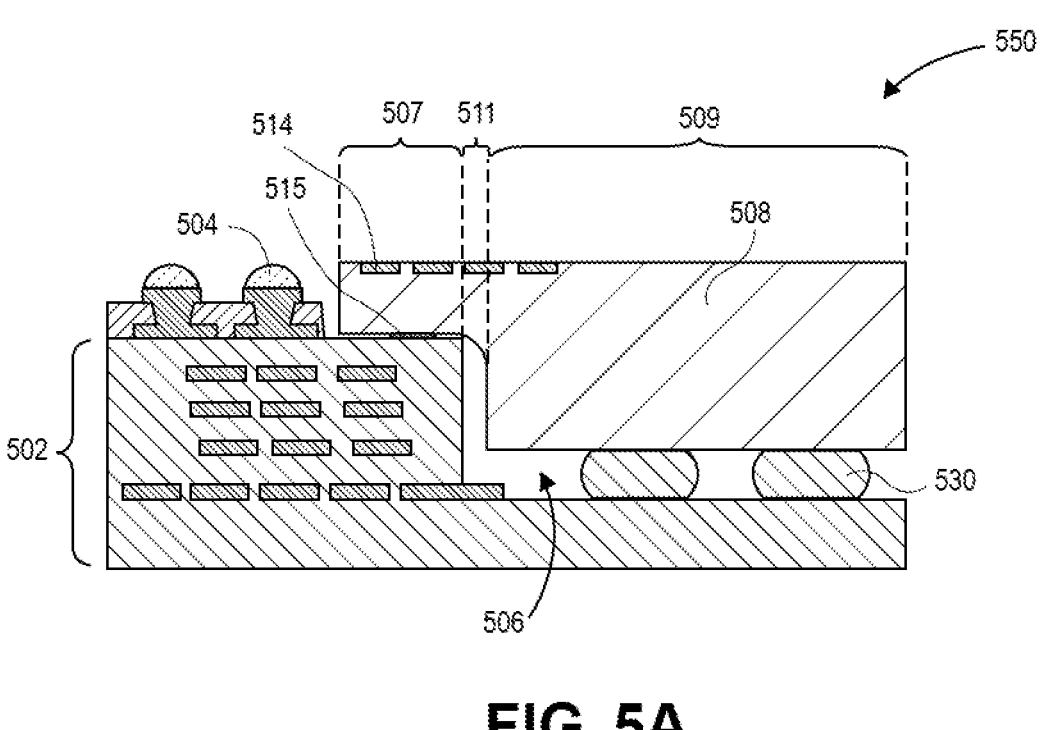
FIGS. 5A-5D illustrates various stages in a manufacturing process to couple a PIC die with a top ledge placed within a substrate cavity with the top ledge coupled with a top of the substrate, in accordance with various embodiments.

FIG. 5A shows package stage 550, where the PIC 508, which may be similar to PIC 308 of FIG. 3, is placed within cavity 506 within substrate 502, which may be similar to cavity 306 within substrate 302 of FIG. 3. A bottom of the thick portion 509 may be physically coupled with the substrate using one or more solder balls 530, which may be similar to solder balls 330 of FIG. 3. A bottom of the thin portion 507, which may be similar to thin portion 307 of FIG. 3, may be physically coupled with a top of the substrate 502. As shown, one or more adhesive dots 515 may be placed between the bottom of the thin portion 507 and the top of the substrate 502 to provide structural support as well as adhesive support during the manufacturing process.

A top of the thin portion 507 may include one or more electrical connections 514, such as electrical connection 314 of FIG. 3. The electrical connections 514 may be pads, solder bumps, or some other type of electrical connection. The top of the substrate 502 may also include electrical connections 504, which may be pads, solder bumps, or some other type of electrical connection. A transition area 511 shows the transition between a bottom of the thin portion 507 and the bottom of the thick portion 509, as described further below.

Figure 5B:
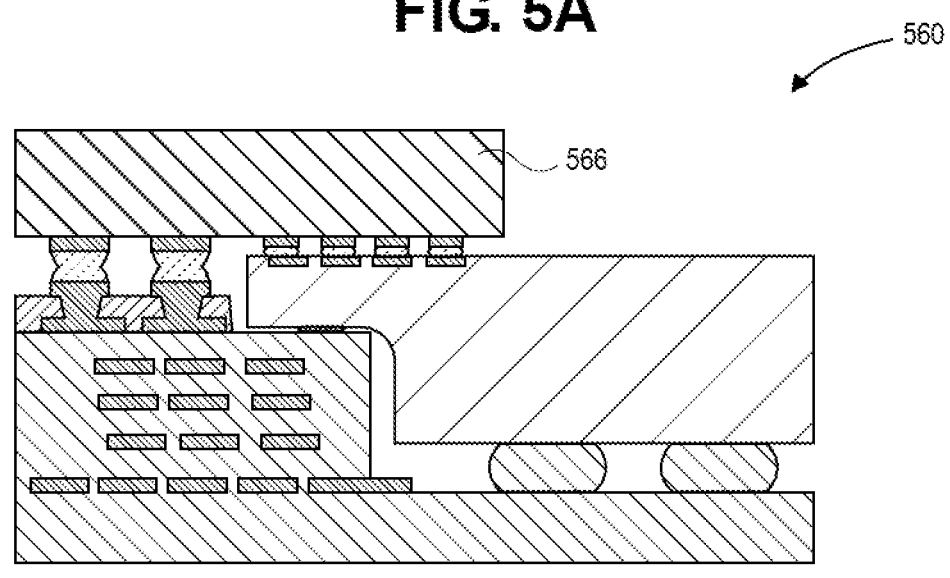

FIG. 5B shows package stage 560, that includes an XPU 566 physically coupled with the substrate 502 and the PIC 508, and electrically coupled with the one or more electrical connections 514 on the thin portion 507 of the PIC 508, and also electrically coupled with the one or more electrical connections 504 on the top of the substrate 502. In embodiments, the XPU 566 may include central processing unit (CPU), graphics processing unit (GPU), electric integrated circuit (EIC), or any other active or passive device.

Figure 5C:
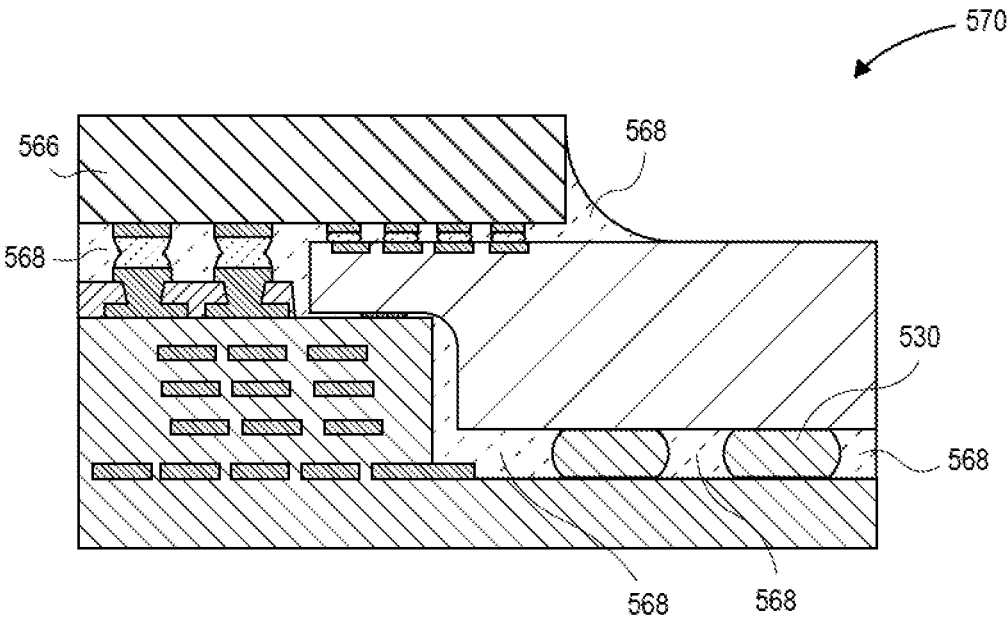

FIG. 5C shows package stage 570 where an underfill 568 has been placed beneath between the PIC 508 the substrate 502 and the XPU 566, and may include cavity 506. In embodiments, the underfill 568 may be an epoxy with or without silica fillers.

Figure 5D:
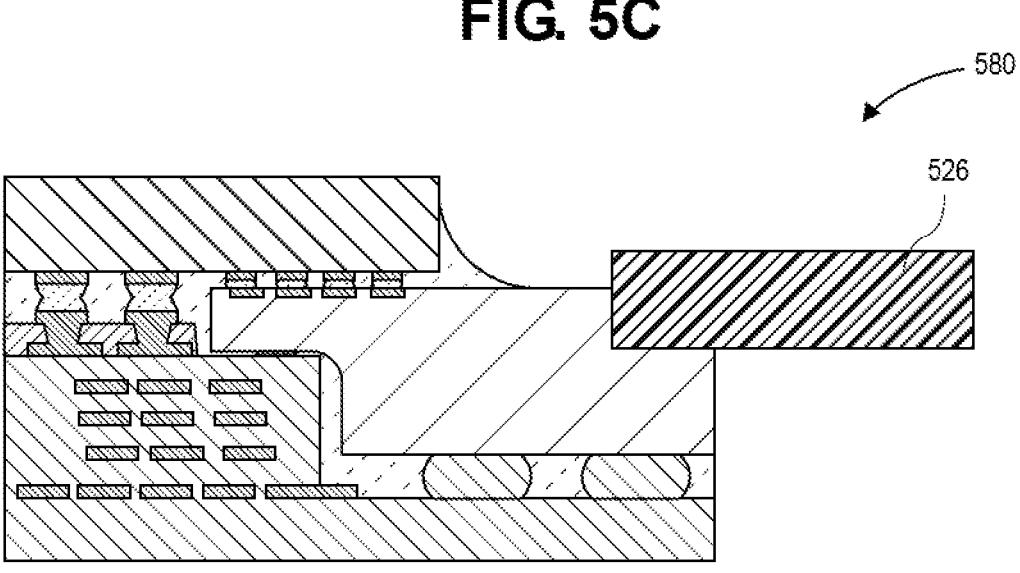

FIG. 5D shows package stage 580 where a fiber attach 526 is added to the PIC 508.

FIG. 6 illustrates an example of a process for coupling a die having a ledge with a substrate that includes a cavity, in accordance with various embodiments. This process may be performed using the techniques, methods, systems, and/or apparatus is described with respect to FIGS. 1-5D.

At block 602, the process may include forming a die having a first side and a second side opposite the first side, the second side having a first level and a second level, wherein the first level of the second side is at a first distance respect to the first side, and the second level of the second side is at a second distance from the first side, wherein the first distance is less than the second distance.

At block 604, the process may further include coupling one or more electrical connections on the first side of the die above the first level of the second side of the die.

Figure 7:
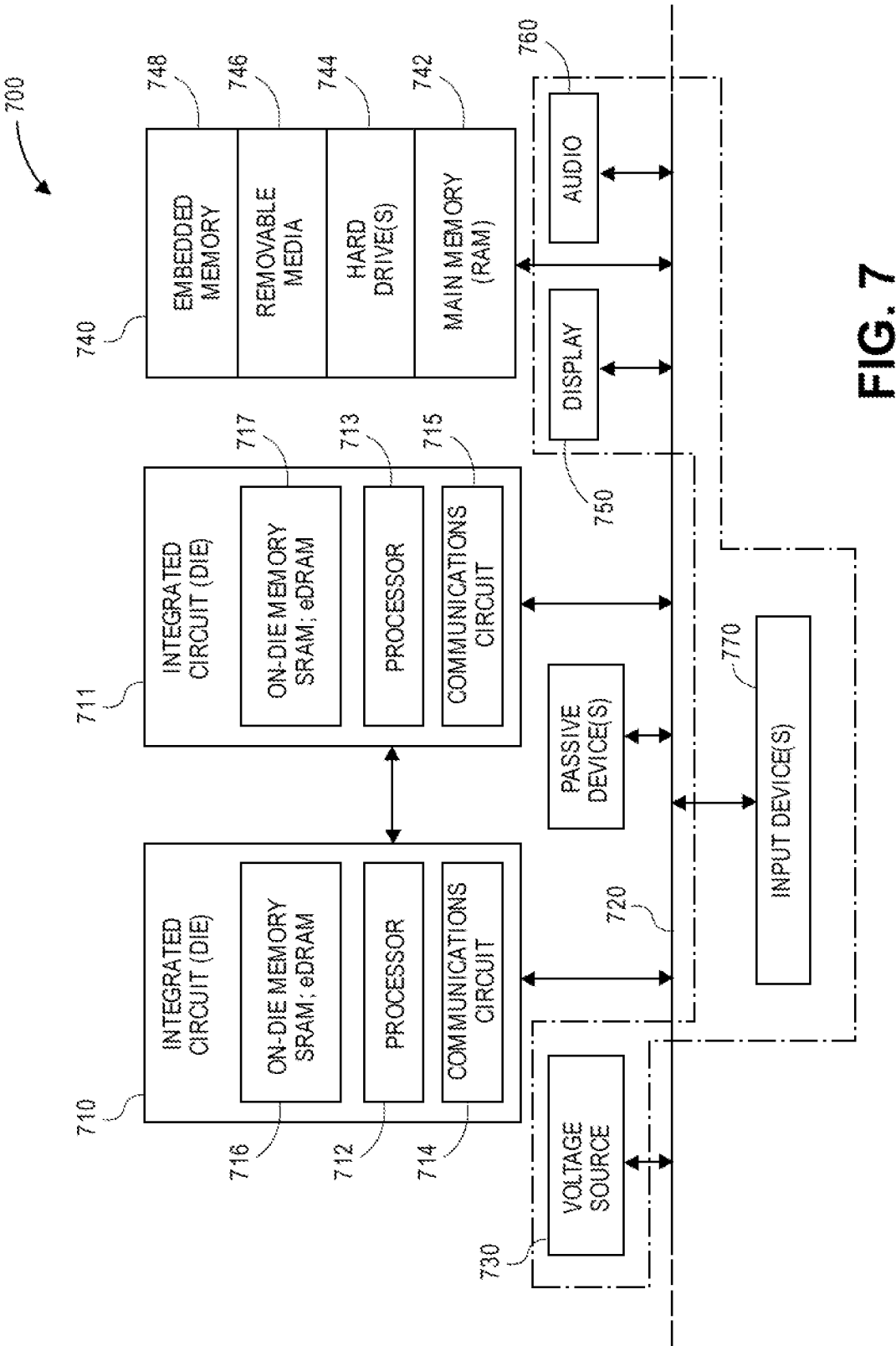
FIG. 7 schematically illustrates a computing device, in accordance with various embodiments.

FIG. 7 schematically illustrates a computing device, in accordance with various embodiments. FIG. 7 is a schematic of a computer system 700, in accordance with an embodiment of the present invention. The computer system 700 (also referred to as the electronic system 700) as depicted can embody multi-level die coupled with a substrate, according to any of the several disclosed embodiments and their equivalents as set forth in this disclosure. The computer system 700 may be a mobile device such as a netbook computer. The computer system 700 may be a mobile device such as a wireless smart phone. The computer system 700 may be a desktop computer. The computer system 700 may be a hand-held reader. The computer system 700 may be a server system. The computer system 700 may be a supercomputer or high-performance computing system.

In an embodiment, the electronic system 700 is a computer system that includes a system bus 720 to electrically couple the various components of the electronic system 700. The system bus 720 is a single bus or any combination of busses according to various embodiments. The electronic system 700 includes a voltage source 730 that provides power to the integrated circuit 710. In some embodiments, the voltage source 730 supplies current to the integrated circuit 710 through the system bus 720.

The integrated circuit 710 is electrically coupled to the system bus 720 and includes any circuit, or combination of circuits according to an embodiment. In an embodiment, the integrated circuit 710 includes a processor 712 that can be of any type. As used herein, the processor 712 may mean any type of circuit such as, but not limited to, a microprocessor, a microcontroller, a graphics processor, a digital signal processor, or another processor. In an embodiment, the processor 712 includes, or is coupled with, multi-level die coupled with a substrate, as disclosed herein. In an embodiment, SRAM embodiments are found in memory caches of the processor. Other types of circuits that can be included in the integrated circuit 710 are a custom circuit or an application-specific integrated circuit (ASIC), such as a communications circuit 714 for use in wireless devices such as cellular telephones, smart phones, pagers, portable computers, two-way radios, and similar electronic systems, or a communications circuit for servers. In an embodiment, the integrated circuit 710 includes on-die memory 716 such as static random-access memory (SRAM). In an embodiment, the integrated circuit 710 includes embedded on-die memory 716 such as embedded dynamic random-access memory (eDRAM).

In an embodiment, the integrated circuit 710 is complemented with a subsequent integrated circuit 711. Useful embodiments include a dual processor 713 and a dual communications circuit 715 and dual on-die memory 717 such as SRAM. In an embodiment, the dual integrated circuit 710 includes embedded on-die memory 717 such as eDRAM.

In an embodiment, the electronic system 700 also includes an external memory X740 that in turn may include one or more memory elements suitable to the particular application, such as a main memory 742 in the form of RAM, one or more hard drives 744, and/or one or more drives that handle removable media 746, such as diskettes, compact disks (CDs), digital variable disks (DVDs), flash memory drives, and other removable media known in the art. The external memory 740 may also be embedded memory 748 such as the first die in a die stack, according to an embodiment.

In an embodiment, the electronic system 700 also includes a display device 750, an audio output 760. In an embodiment, the electronic system 700 includes an input device such as a controller 770 that may be a keyboard, mouse, trackball, game controller, microphone, voice-recognition device, or any other input device that inputs information into the electronic system 700. In an embodiment, an input device 770 is a camera. In an embodiment, an input device X770 is a digital sound recorder. In an embodiment, an input device 770 is a camera and a digital sound recorder.

As shown herein, the integrated circuit 710 can be implemented in a number of different embodiments, including a package substrate having multi-level die coupled with a substrate, according to any of the several disclosed embodiments and their equivalents, an electronic system, a computer system, one or more methods of fabricating an integrated circuit, and one or more methods of fabricating an electronic assembly that includes a package substrate having multi-level die coupled with a substrate, according to any of the several disclosed embodiments as set forth herein in the various embodiments and their art-recognized equivalents. The elements, materials, geometries, dimensions, and sequence of operations can all be varied to suit particular I/O coupling requirements including array contact count, array contact configuration for a microelectronic die embedded in a processor mounting substrate according to any of the several disclosed package substrates having multi-level die coupled with a substrate embodiments and their equivalents. A foundation substrate may be included, as represented by the dashed line of FIG. 7. Passive devices may also be included, as is also depicted in FIG. 7.

Various embodiments may include any suitable combination of the above-described embodiments including alternative (or) embodiments of embodiments that are described in conjunctive form (and) above (e.g., the "and" may be "and/or"). Furthermore, some embodiments may include one or more articles of manufacture (e.g., non-transitory computer-readable media) having instructions, stored thereon, that when executed result in actions of any of the above-described embodiments. Moreover, some embodiments may include apparatuses or systems having any suitable means for carrying out the various operations of the above-described embodiments.

The above description of illustrated embodiments, including what is described in the Abstract, is not intended to be exhaustive or to limit embodiments to the precise forms disclosed. While specific embodiments are described herein for illustrative purposes, various equivalent modifications are possible within the scope of the embodiments, as those skilled in the relevant art will recognize.

These modifications may be made to the embodiments in light of the above detailed description. The terms used in the following claims should not be construed to limit the embodiments to the specific implementations disclosed in the specification and the claims. Rather, the scope of the invention is to be determined entirely by the following claims, which are to be construed in accordance with established doctrines of claim interpretation.

The following paragraphs describe examples of various embodiments.

EXAMPLES

Example 1 is an apparatus, comprising: a die having a first side and a second side opposite the first side, the second side having a first level and a second level, wherein the first level of the second side is at a first distance with respect to the first side, and the second level of the second side is at a second distance from the first side, wherein the first distance is less than the second distance; and one or more electrical connections on the first side of the die.

Example 2 includes the apparatus of example 1, wherein the one or more electrical connections on the first side of the die are above the first level of the second side of the die.

Example 3 includes the apparatus of example 1, wherein the one or more electrical connections are a selected one or more of: a pad or a solder ball.

Example 4 includes the apparatus of example 1, wherein the die includes a photonics integrated circuit (PIC).

Example 5 includes the apparatus of example 1, wherein the first level of the second side includes one or more adhesive features.

Example 6 includes the apparatus of example 1, further comprising a transition structure between the first level of the second side and the second level of the second side that provides structural support for a volume of the die between the first side of the die and the first level of the second side of the die.

Example 7 includes the apparatus of example 6, wherein the transition structure is a chamfer geometry between the first level of the second side to the second level of the second side.

Example 8 includes the apparatus of example 7, wherein the chamfer geometry includes a radius.

Example 9 includes the apparatus of any one of examples 1-8, wherein the first side of the die includes one or more laser routing features.

Example 10 includes the apparatus of any one of examples 1-8, further comprising a fiber attach coupled to a side of the die.

Example 11 includes the apparatus of example 10, wherein the fiber attached is coupled between the first side of the die and the second level of the second side of the die.

Example 12 includes the apparatus of any one of examples 1-8, wherein the second level of the second side includes one or more solder bumps.

Example 13 is a method comprising: forming a die having a first side and a second side opposite the first side, the second side having a first level and a second level, wherein the first level of the second side is at a first distance respect to the first side, and the second level of the second side is at a second distance from the first side, wherein the first distance is less than the second distance; and coupling one or more electrical connections on the first side of the die above the first level of the second side of the die.

Example 14 includes the method of example 13, further comprising placing an adhesive onto the first level of the second side of the die.

Example 15 includes the method of example 13, further comprising coupling one or more solder bumps with the second level of the second side of the die.

Example 16 includes the method of any one of examples 13-15, further comprising: coupling the die to a substrate that has a first side and a second side opposite the first side, the first side of the substrate having a first level and a second level, wherein the first level of the first side of the substrate is at a first distance with respect to the second side of the substrate, and the second level of the first side of the substrate is at a second distance with respect to the second side of the substrate, wherein the first distance is greater than the second distance, wherein the first level of the second side of the die is physically coupled with the first level of the first side of the substrate, and wherein the second level of the second side of the die is physically coupled with the second-level of the first side of the substrate.

Example 17 is a package comprising: a die having a first side and a second side opposite the first side, the second side having a first level and a second level, wherein the first level of the second side is at a first distance with respect to the first side, and the second level of the second side is at a second distance from the first side, wherein the first distance is less than the second distance; a substrate that has a first side and a second side opposite the first side, the first side of the substrate having a first level and a second level, wherein the first level of the first side of the substrate is at a first distance with respect to the second side of the substrate, and the second level of the first side of the substrate is at a second distance with respect to the second side of the substrate, wherein the first distance is greater than the second distance; wherein the first level of the second side of the die is physically coupled with the first level of the first side of the substrate, and wherein the second level of the second side of the die is physically coupled with the second-level of the first side of the substrate.

Example 18 includes the package of example 17, wherein the first level of the second side of the die is physically coupled with the first level of the first side of the substrate using an adhesive; or wherein the second level of the second side of the die is physically coupled with the second-level of the first side of the substrate using one or more solder balls.

Example 19 includes the package of example 18, wherein die is a photonics integrated circuit (PIC); and further comprising: a fiber attach coupled with the die at an end of the die opposite an end of the die coupled with the first level of the substrate.

Example 20 includes the package of any one of examples 18-19, further comprising another die, wherein the other die is physically and electrically coupled with the first side of the substrate and physically and electrically coupled with the first side of the PIC above the first level of the second side of the PIC.

What is claimed is:

1. An apparatus, comprising:
a single integrated circuit die having a first side and a second side opposite the first side, the second side having a first level and a second level, wherein the first level of the second side is at a first distance with respect to the first side, and the second level of the second side is at a second distance from the first side, wherein the first distance is less than the second distance; and
one or more electrical connections on the first side of the single integrated circuit die, the one or more electrical connections vertically overlapping with the first level of the second side of the single integrated circuit die.

2. The apparatus of claim 1, wherein the one or more electrical connections on the first side of the single integrated circuit die are above the first level of the second side of the single integrated circuit die.

3. The apparatus of claim 1, wherein the one or more electrical connections are a selected one or more of: a pad or a solder ball.

4. The apparatus of claim 1, wherein the single integrated circuit die includes a photonics integrated circuit (PIC).

5. The apparatus of claim 1, wherein the first level of the second side includes one or more adhesive features.

6. The apparatus of claim 1, further comprising a transition structure between the first level of the second side and the second level of the second side that provides structural support for a volume of the single integrated circuit die between the first side of the single integrated circuit die and the first level of the second side of the single integrated circuit die.

7. The apparatus of claim 6, wherein the transition structure is a chamfer geometry between the first level of the second side to the second level of the second side.

8. The apparatus of claim 7, wherein the chamfer geometry includes a radius.

9. The apparatus of claim 1, wherein the first side of the single integrated circuit die includes one or more laser routing features.

10. The apparatus of claim 1, further comprising a fiber attach coupled to a side of the single integrated circuit die.

11. The apparatus of claim 10, wherein the fiber attached is coupled between the first side of the single integrated circuit die and the second level of the second side of the single integrated circuit die.

12. The apparatus of claim 1, wherein the second level of the second side includes one or more solder bumps.

13. A method comprising:
forming a single integrated circuit die having a first side and a second side opposite the first side, the second side having a first level and a second level, wherein the first level of the second side is at a first distance respect to the first side, and the second level of the second side is at a second distance from the first side, wherein the first distance is less than the second distance; and
coupling one or more electrical connections on the first side of the single integrated circuit die above the first level of the second side of the single integrated circuit die, the one or more electrical connections vertically overlapping with the first level of the second side of the single integrated circuit die.

14. The method of claim 13, further comprising placing an adhesive onto the first level of the second side of the single integrated circuit die.

15. The method of claim 13, further comprising coupling one or more solder bumps with the second level of the second side of the single integrated circuit die.

16. The method of claim 13, further comprising:
coupling the single integrated circuit die to a substrate that has a first side and a second side opposite the first side, the first side of the substrate having a first level and a second level, wherein the first level of the first side of the substrate is at a first distance with respect to the second side of the substrate, and the second level of the first side of the substrate is at a second distance with respect to the second side of the substrate, wherein the first distance is greater than the second distance,
wherein the first level of the second side of the single integrated circuit die is physically coupled with the first level of the first side of the substrate, and
wherein the second level of the second side of the single integrated circuit die is physically coupled with the second-level of the first side of the substrate.

17. A package comprising:
a single integrated circuit die having a first side and a second side opposite the first side, the second side having a first level and a second level, wherein the first level of the second side is at a first distance with respect to the first side, and the second level of the second side is at a second distance from the first side, wherein the first distance is less than the second distance, and wherein one or more electrical connections are on the first side of the single integrated circuit die, the one or more electrical connections vertically overlapping with the first level of the second side of the single integrated circuit die;

a substrate that has a first side and a second side opposite the first side, the first side of the substrate having a first level and a second level, wherein the first level of the first side of the substrate is at a first distance with respect to the second side of the substrate, and the second level of the first side of the substrate is at a second distance with respect to the second side of the substrate, wherein the first distance is greater than the second distance;

wherein the first level of the second side of the single integrated circuit die is physically coupled with the first level of the first side of the substrate, and wherein the second level of the second side of the single integrated circuit die is physically coupled with the second-level of the first side of the substrate.

18. The package of claim 17, wherein the first level of the second side of the single integrated circuit die is physically coupled with the first level of the first side of the substrate using an adhesive; or wherein the second level of the second side of the single integrated circuit die is physically coupled with the second-level of the first side of the substrate using one or more solder balls.

19. The package of claim 18, wherein single integrated circuit die is a photonics integrated circuit (PIC); and further comprising:

a fiber attach coupled with the single integrated circuit die at an end of the single integrated circuit die opposite an end of the single integrated circuit die coupled with the first level of the substrate.

20. The package of claim 18, further comprising another single integrated circuit die, wherein the other single integrated circuit die is physically and electrically coupled with the first side of the substrate and physically and electrically coupled with the first side of the PIC above the first level of the second side of the PIC.

21. An apparatus, comprising:

a die having a first side and a second side opposite the first side, the second side having a first level and a second level, wherein the first level of the second side is at a first distance with respect to the first side, and the second level of the second side is at a second distance from the first side, wherein the first distance is less than the second distance, wherein the die includes a photonics integrated circuit (PIC); and one or more electrical connections on the first side of the die.

* * * * *